(12) United States Patent
Orita et al.

(10) Patent No.: US 9,103,028 B2
(45) Date of Patent: Aug. 11, 2015

(54) METHOD FOR FORMING METAL OXIDE FILM, METAL OXIDE FILM, AND APPARATUS FOR FORMING METAL OXIDE FILM

(75) Inventors: Hiroyuki Orita, Tokyo (JP); Takahiro Shirahata, Tokyo (JP); Akio Yoshida, Tokyo (JP); Shizuo Fujita, Kyoto (JP); Naoki Kameyama, Kyoto (JP)

(73) Assignees: TOSHIBA MITSUBISHI—ELECTRIC INDUSTRIAL SYSTEMS CORPORATION, Tokyo (JP); KYOTO UNIVERSITY, Kyoto-shi (JP)

( * ) Notice: Subject to any disclaimer, the term of this patent is extended or adjusted under 35 U.S.C. 154(b) by 575 days.

(21) Appl. No.: 13/265,193

(22) PCT Filed: Apr. 20, 2009

(86) PCT No.: PCT/JP2009/057858
§ 371 (c)(1),
(2), (4) Date: Nov. 8, 2011

(87) PCT Pub. No.: WO2010/122629
PCT Pub. Date: Oct. 28, 2010

(65) Prior Publication Data
US 2012/0040083 A1  Feb. 16, 2012

(51) Int. Cl.
*C23C 16/40* (2006.01)
*C23C 16/448* (2006.01)
(52) U.S. Cl.
CPC ............ *C23C 16/407* (2013.01); *C23C 16/405* (2013.01); *C23C 16/448* (2013.01); *C23C 16/4486* (2013.01)

(58) Field of Classification Search
CPC ............................. C23C 16/40; C23C 16/448
USPC .................................................... 427/8, 248.1
See application file for complete search history.

(56) References Cited

U.S. PATENT DOCUMENTS

| 5,474,939 A | * | 12/1995 | Pollock et al. | .................. 438/85 |
| 6,235,112 B1 | * | 5/2001 | Satoh | ............................. 118/300 |
| 2003/0020157 A1 | | 1/2003 | Natori et al. | |

(Continued)

FOREIGN PATENT DOCUMENTS

| JP | 9-59089 | | 3/1997 |
| JP | 9-195050 | A | 7/1997 |

(Continued)

OTHER PUBLICATIONS

Combined Chinese Office Action and Search Report issued Feb. 17, 2013, in Chinese Patent Application No. 200980158921.8 with partial English translation.

(Continued)

*Primary Examiner* — Nathan T Leong
(74) *Attorney, Agent, or Firm* — Oblon, McClelland, Maier & Neustadt, L.L.P.

(57) ABSTRACT

The present invention aims at providing a method for forming a metal oxide film which can further improve the production efficiency while maintaining low resistance of a metal oxide film formed thereby. In the method for forming a metal oxide film of the present invention, a solution (4) containing a metallic element and ammonia (4a) is formed into a mist. Meanwhile, a substrate (2) is heated. Then, the solution (4) formed into a mist is supplied onto a first main surface of the substrate (2) being heated.

19 Claims, 5 Drawing Sheets

(56) References Cited

U.S. PATENT DOCUMENTS

| | | | |
|---|---|---|---|
| 2003/0021079 | A1 | 1/2003 | Natori et al. |
| 2006/0051601 | A1 | 3/2006 | Natori et al. |
| 2006/0120940 | A1 | 6/2006 | Natori et al. |
| 2008/0159939 | A1 | 7/2008 | Natori et al. |
| 2009/0230821 | A1 | 9/2009 | Natori et al. |
| 2010/0207492 | A1 | 8/2010 | Natori et al. |
| 2010/0289384 | A1 | 11/2010 | Natori et al. |
| 2011/0143053 | A1 | 6/2011 | Shirahata et al. |
| 2011/0151619 | A1 | 6/2011 | Orita et al. |

FOREIGN PATENT DOCUMENTS

| | | |
|---|---|---|
| JP | 10-195086 | 7/1998 |
| JP | 2002-146536 | 5/2002 |
| JP | 2004-335607 | 11/2004 |
| JP | 2006-160600 | 6/2006 |
| JP | 2007-144297 | 6/2007 |
| JP | 2007-242340 A | 9/2007 |
| JP | 2008-78113 A | 4/2008 |
| JP | 2010-084179 A | 4/2010 |
| WO | WO 02/102712 A1 | 12/2002 |
| WO | WO 2010/035312 A1 | 4/2010 |
| WO | WO 2010/035313 A1 | 4/2010 |

OTHER PUBLICATIONS

Office Action issued May 10, 2013, in Korean Patent Application No. 10-2011-7024585 with partial English translation.

U.S. Appl. No. 13/383,766, filed Jan. 12, 2012, Orita, et al.

International Preliminary Report on Patentability and Written Opinion of the International Searching Authority issued Nov. 3, 2011 in PCT/JP2009/057858 (with English-language translation).

International Search Report issued Jul. 14, 2009, in Patent Application No. PCT/JP2009/057858.

Zhenguo Ji, et al, "Fabrication and characterization of p-type ZnO films by pyrolysis of zinc-acetate-ammonia solution", Journal of Crystal Growth, vol. 253, No. 1/4, Jun. 2003, pp. 239-242.

Arturo I. Martinez, et al, "Effect of the fluorine content on the structual and electrical properties of $SnO_2$ and $ZnO$—$SnO_2$ thin films prepared by spray pyrolysis", Thin Solid Films, vol. 483, No. 1-2, Jul. 1, 2005, pp. 107-113.

M.de la L. Olvera, et al, "ZnO:F thin films deposited by chemical spray: effect of the fluorine concentration in the starting solution", Solar Energy Materials & Solar Cells, vol. 73, No. 4, Aug. 2002, pp. 425-433.

U.S. Appl. No. 14/131,128, filed Jan. 6, 2014, Orita, et al.

"Doping Technique of ZoN Semiconductor Material and Application thereof," Zhizhen Ye, Zhejiang University Press, Jan. 2009, pp. 3, 11, 12, 34, 57, 108 (w/ partial English Translation).

* cited by examiner

METHOD FOR FORMING METAL OXIDE FILM, METAL OXIDE FILM, AND APPARATUS FOR FORMING METAL OXIDE FILM

TECHNICAL FIELD

The present invention relates to a method for forming a metal oxide film by which a metal oxide film is formed on a substrate, and an apparatus for forming a metal oxide film which can perform the method for forming a metal oxide film. Moreover, the present invention relates to a metal oxide film formed by the method for forming a metal oxide film.

BACKGROUND ART

In the field of a solar cell, a light-emitting device and a touch panel, a metal oxide film is formed on a substrate. Conventionally, there are Patent Documents 1, 2, and 3 as a non-vacuum film forming technique which forms a metal oxide film on a substrate.

In the technique of Patent Document 1, a metal oxide film is formed on a substrate by bringing a solution in which a metal salt or a metal complex is dissolved into contact with a heated substrate. In this technique, at least one of an oxidizing agent and a reducing agent is contained in the solution.

In the technique of Patent Document 2, a tetrabutyltin solution or a tin tetrachloride solution, in which hydrogen peroxide is added as an oxidizing agent, is sprayed onto a preheated substrate and thermally decomposed. Then, after the substrate temperature lowered by spraying of the solution returns, the solution is sprayed repeatedly. Thereby, a thin film of tin oxide is grown on the surface of the substrate.

In the technique of Patent Document 3, a solution in which a thin film material is dissolved in a volatile solvent is intermittently sprayed toward a substrate kept hot from above to form a transparent conductive film on the surface of the substrate. In this technique, intermittent spraying is high-speed pulsed intermittent spraying in which one spraying duration is 100 milliseconds or less.

PRIOR ART DOCUMENTS

Patent Documents

Patent Document 1: Japanese Patent Application Laid-Open No. 2006-160600
Patent Document 2: Japanese Patent Application Laid-Open No. 2002-146536
Patent Document 3: Japanese Patent Application Laid-Open No. 2007-144297

SUMMARY OF THE INVENTION

Problems to be Solved by the Invention

In the present situation, a film forming method is desired, which can further improve the production efficiency while maintaining low resistance of a metal oxide film formed thereby.

Thus, it is an object of the present invention to provide a method for forming a metal oxide film which can further improve the production efficiency while maintaining low resistance of a metal oxide film formed thereby, and an apparatus for forming a metal oxide film which can perform the method for forming a metal oxide film. The present invention also aims to provide a metal oxide film formed by the method for forming a metal oxide film.

Means for Solving the Problems

In order to achieve the above-mentioned object, in accordance with the present invention, in the method for forming a metal oxide film and the apparatus for forming a metal oxide film, a solution containing a metallic element and ammonia is formed into a mist. Meanwhile, a substrate is heated. Then, the solution formed into a mist is supplied onto a first main surface of the substrate being heated.

Effects of the Invention

In accordance with the present invention, in the method for forming a metal oxide film and the apparatus for forming a metal oxide film, a solution containing a metallic element, which is formed into a mist, is supplied onto the first main surface of the substrate being heated. The solution also contains ammonia.

Therefore, the method for forming a metal oxide film and the apparatus for forming a metal oxide film of the present invention can further improve the production efficiency of the metal oxide while maintaining low resistance of a metal oxide film formed thereby.

The object, features, aspects and advantages of the present invention will become more apparent from the following detailed description and the attached drawings.

EMBODIMENTS FOR CARRYING OUT THE INVENTION

Embodiment 1

Figure 1:
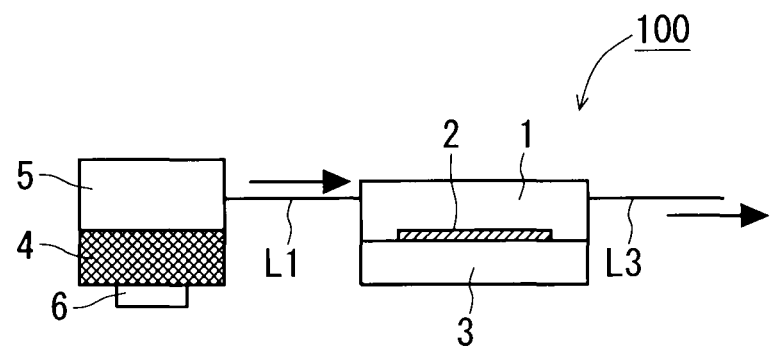
FIG. 1 is a drawing showing a schematic configuration of an apparatus for forming a metal oxide film of Embodiment 1.

FIG. 1 is a drawing showing a schematic configuration of an apparatus for forming a metal oxide film of the present embodiment.

As shown in FIG. 1, an apparatus 100 for forming a metal oxide film of Embodiment 1 is configured of a reaction chamber 1, a heating unit 3, a solution container 5 and a mist forming unit 6.

In the film forming apparatus 100, a spray pyrolysis method, a pyrosol method, a mist deposition method or the like is carried out. That is, in the film forming apparatus 100, by spraying a predetermined solution formed into a mist onto a first main surface of a substrate 2, a predetermined metal oxide film can be formed on the first main surface of the substrate 2.

In a state where the substrate 2 is placed on the heating unit 3, a metal oxide film is formed on the first main surface of the substrate 2 by a predetermined reaction in the reaction chamber 1. In addition, in the state where the substrate 2 is placed on the heating unit 3, a second main surface of the substrate 2 contacts the heating unit 3. As is apparent from this description, the first main surface of the substrate 2, referred to in the present specification, is a main surface of the substrate 2 on a side where the metal oxide film is formed. On the other hand, the second main surface of the substrate 2, referred to in the present specification, is a main surface of the substrate 2 on a side where the substrate 2 is placed on the heating unit 3.

Here, the metal oxide film may be formed on the substrate 2 under an atmospheric pressure by setting the internal pressure of the reaction chamber 1 at an atmospheric pressure, or the metal oxide film may be formed on the substrate 2 in an atmosphere of a reduced pressure while reducing the internal pressure of the reaction chamber 1 within a range of 0.0001 to 0.1 MPa.

As the substrate 2, a glass substrate, a plastic substrate, a resin film and the like, which are used in the fields of a solar cell, a light-emitting device, a touch panel and a flat-panel display such as a liquid crystal panel, can be employed.

The heating unit 3 is a heater or the like and can heat the substrate 2 placed on the heating unit 3. The heating temperature of the heating unit 3 is adjusted by an external control part, and the heating unit 3 is heated to a metal oxide film forming temperature during film forming treatment.

The solution container 5 is filled with a material solution (hereinafter, referred to as a solution) 4 containing a metal salt, a metal complex or a metal alkoxide compound dissolved therein as a metal source. The metal source contained in the solution 4 can be arbitrarily selected according to the use of the metal oxide film to be formed. For example, titanium (Ti), zinc (Zn), indium (In) and tin (Sn), or at least any one thereof can be employed as the metal source.

Further, the dopant source described later does not have to be contained in the solution 4. However, it is desired that at least any one metallic element of boron (B), nitrogen (N), fluorine (F), magnesium (Mg), aluminum (Al), phosphorus (P), chlorine (Cl), gallium (Ga), arsenic (As), niobium (Nb), indium (In) and antimony (Sb) is contained in the solution 4 as a dopant source.

Water, alcohols such as ethanol and methanol, and mixed solutions thereof can be employed as a solvent of the solution 4.

Further, in the present invention, the solution 4 contains ammonia.

Figure 2:
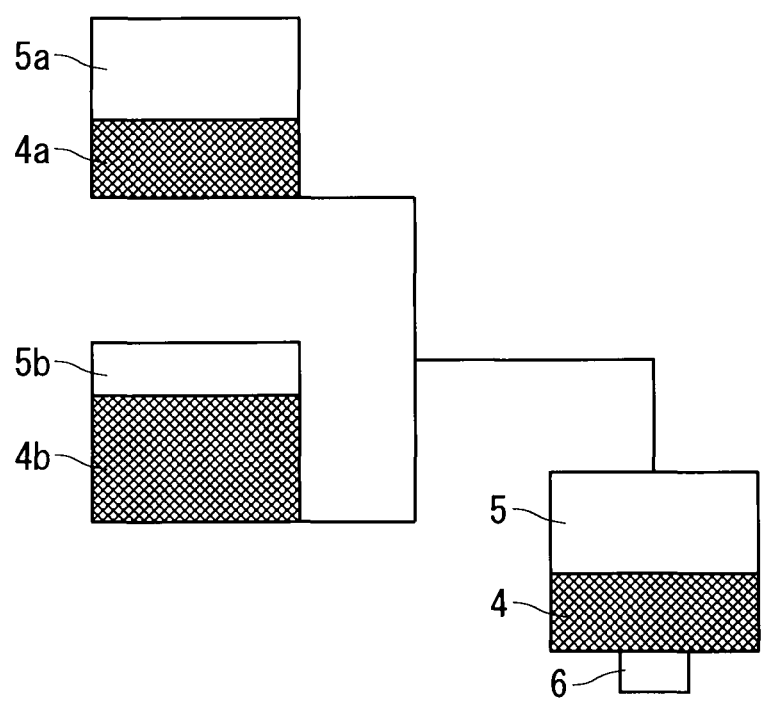
FIG. 2 is a drawing for illustrating a method of preparing a solution containing a designated content of ammonia.

As shown in FIG. 2, the film forming apparatus 100 includes a container 5a and a container 5b separately. The container 5a houses, for example, an ammonia ($NH_3$) solution 4a, of which concentration by volume is 28 vol %. On the other hand, the container 5b houses components other than the ammonia 4a, namely, a solution (hereinafter, referred to as a source solution) 4b made of the above-mentioned metal source, the above-mentioned solvent and/or the above-mentioned dopant source.

An operation on the film forming apparatus 100 is externally performed in order to prepare the solution 4. The operation is an operation for adjusting/determining the content of ammonia in the solution 4. When the operation is performed on the film forming apparatus 100, a predetermined amount of the ammonia solution 4a is output from the container 5a, and another predetermined amount of the source solution 4b is output from the container 5b. Accordingly, the respectively output ammonia solution 4a and source solution 4b are supplied to the solution container 5, and the solution 4 containing ammonia with the content determined by the above-mentioned operation is prepared in the solution container 5.

For example, an ultrasonic atomizer can be employed as the mist forming unit 6. The mist forming unit 6 which is the ultrasonic atomizer forms the solution 4 in the solution container 5 into a mist by applying an ultrasonic wave to the solution 4 in the solution container 5. The solution 4 formed into a mist is supplied toward the first main surface of the substrate 2 in the reaction chamber 1 through a path L1.

In addition, when the misty solution 4 is supplied to the reaction chamber 1, the solution 4 reacts on the substrate 2 being heated and a predetermined metal oxide film is formed on the first main surface of the substrate 2. The metal oxide film formed depends on the kind of the solution 4, and examples thereof include transparent conductive films such as indium oxide, zinc oxide, and tin oxide films. Here, unreacted ozone or solution 4 in the reaction chamber 1 is always (continuously) discharged out of the reaction chamber 1 through a path L3.

Next, a method for forming a metal oxide film of the present embodiment will be described.

First, the solution 4 is prepared by mixing the ammonia solution 4a with the source solution 4b.

Specifically, the film forming apparatus 100 includes an input part so that the content of ammonia in the solution 4 can be input/selected. A user performs the operation of input or selection of a value desired as the ammonia content on the input part. Then, an ammonia solution 4a is output from the container 5a in a first amount according to the operation. On the other hand, a source solution 4b is output from the container 5b in a second amount according to the operation. Then, the respectively output ammonia solution 4a and source solution 4b are supplied to the solution container 5, and a solution 4 is prepared in the solution container 5. Here, the content of ammonia in the solution 4 is a desired value in the above-mentioned operation.

Figure 3:
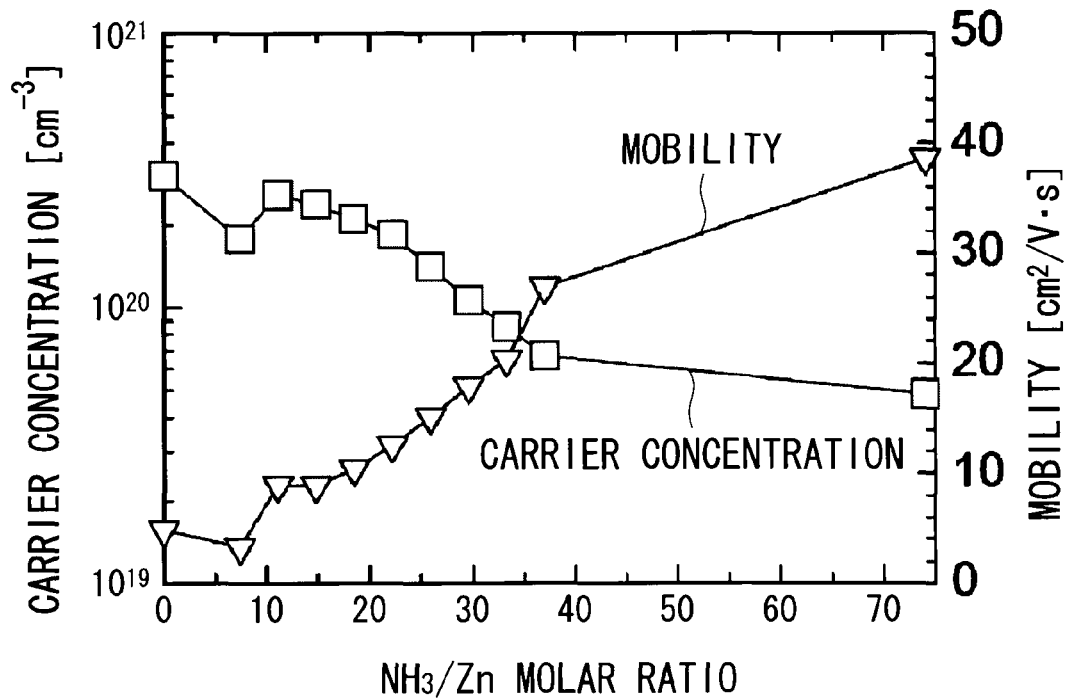
FIG. 3 is a graph showing a relationship among the ammonia content, carrier concentration and mobility, which is used in determining the content of ammonia in a solution 4.
Figure 4:
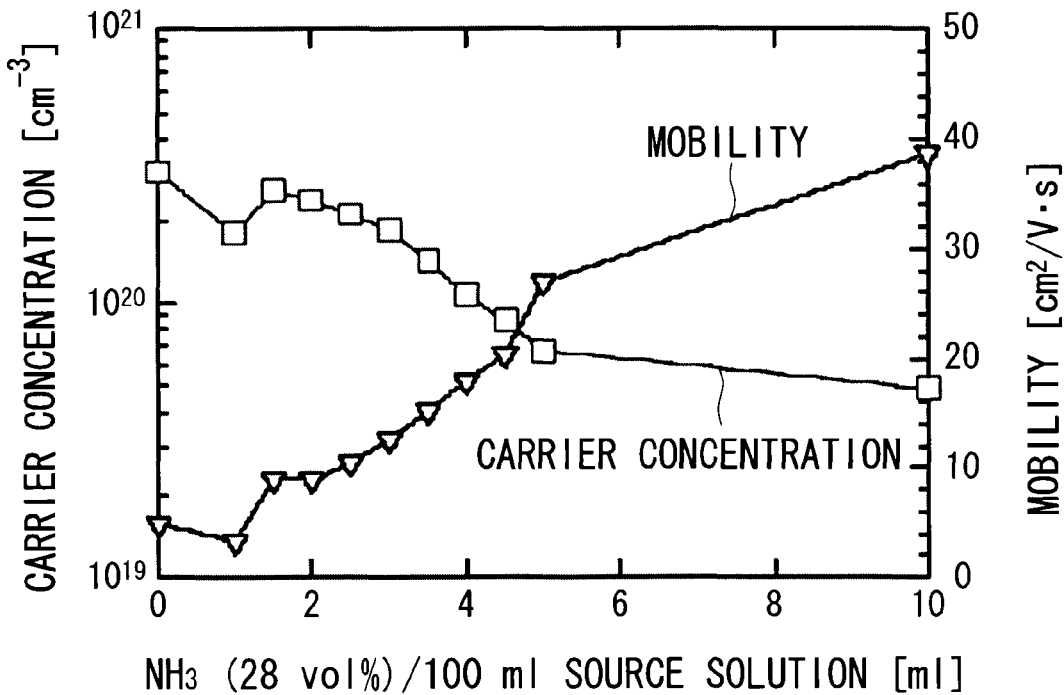
FIG. 4 is a graph showing a relationship among the ammonia content, carrier concentration and mobility, which is used in determining the content of ammonia in the solution 4.

Here, the present inventors found out that relationships shown in FIGS. 3 and 4 exist among the ammonia content in the solution 4, the carrier concentration of the metal oxide film formed and the mobility of the metal oxide film formed.

Vertical axes on a left side in FIGS. 3 and 4 indicate the carrier concentration ($cm^{-3}$) of the metal oxide film formed. Further, vertical axes on a right side in FIGS. 3 and 4 indicate the mobility ($cm^2/V \cdot s$) of the metal oxide film formed. The horizontal axis in FIG. 3 indicates a molar ratio of ammonia ($NH_3$) to zinc (Zn). Further, the horizontal axis in FIG. 4 indicates the content (ml) of the ammonia solution 4a, of which concentration by volume is 28 vol %, in 100 ml of the source solution 4b. Further, "square marks" in FIGS. 3 and 4 are data showing a relationship between the ammonia content and the carrier concentration. Further, "triangular marks" in FIGS. 3 and 4 are data showing a relationship between the ammonia content and the mobility.

Here, as the "source solution" 4b in FIG. 4, a solution, which is formed by adding zinc acetyl acetonate and gallium acetyl acetonate to a mixed solution made of water and nine times its volume of methanol and has a zinc molar concentration of 0.02 mol/L, is employed.

It is understood from FIG. 3 that the carrier concentration of the metal oxide film formed is reduced as the content of ammonia to the content of zinc as a metal source increases in the solution 4. Further, it is understood from FIG. 3 that the mobility of the metal oxide film formed is increased as the content of ammonia to the content of zinc as a metal source increases in the solution 4.

Further, it is understood from FIG. 4 that the carrier concentration of the metal oxide film formed is reduced as the ammonia content increases in the solution 4. Further, it is understood from FIG. 4 that the mobility of the metal oxide film formed is increased as the ammonia content increases in the solution 4.

As is well known, the resistivity of the metal oxide film formed is proportional to an inverse number of carrier concentration×mobility.

Accordingly, data shown in FIGS. 3 and 4 are previously prepared prior to preparation of the solution 4. Moreover, a user considers physical properties (e.g., transmittance) of the metal oxide film, which vary by changes in the resistivity, mobility and carrier concentration of a metal oxide film formed. When the selection/input operation of the ammonia content is performed, a user considers the above-mentioned matters and determines the content of ammonia in the solution 4 according to use of the metal oxide film formed, by use of data shown in FIGS. 3 and 4.

After the solution 4 is prepared in the solution container 5, the solution 4 is formed into a mist by the mist forming unit 6 in the solution container 5. The solution 4 formed into a mist is supplied to the reaction chamber 1 through the path L1.

On the other hand, the substrate 2 placed on the heating unit 3 is heated to a metal oxide film forming temperature by the heating unit 3, and the temperature of the substrate 2 is maintained at the metal oxide film forming temperature. For example, the temperature of the substrate 2 is maintained at 300° C. or less.

The misty solution 4 is supplied to the first main surface of the substrate 2 being heated. Thereby, a predetermined metal oxide film is formed on the first main surface of the substrate 2 present in the reaction chamber 1.

Here, the step of forming a film may be a step of supplying the solution 4 to the substrate 2 disposed under an atmospheric pressure and forming a metal oxide film on the substrate 2. On the other hand, it is also possible to employ a step of supplying the solution 4 to the substrate 2 disposed in an atmosphere of a reduced pressure (e.g., 0.0001 to 0.1 MPa) by including additionally a vacuum pump (not shown) capable of reducing the internal pressure of the reaction chamber 1 in the film forming apparatus 100, and forming a metal oxide film on the substrate 2.

As described above, in the method for forming a metal oxide film of the present embodiment, the solution 4 containing ammonia in addition to the metallic element is formed into a mist. Moreover, in the reaction chamber 1, the misty solution 4 is brought into contact with the heated substrate 2.

Figure 5:
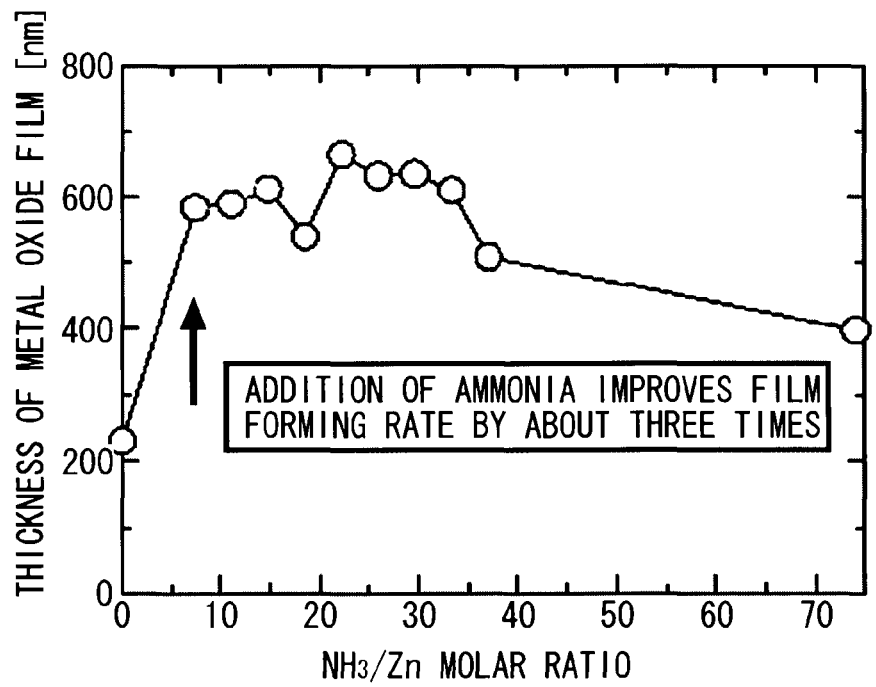
FIG. 5 is a graph for illustrating the effect in the case of employing a method for forming a film of Embodiment 1.
Figure 6:
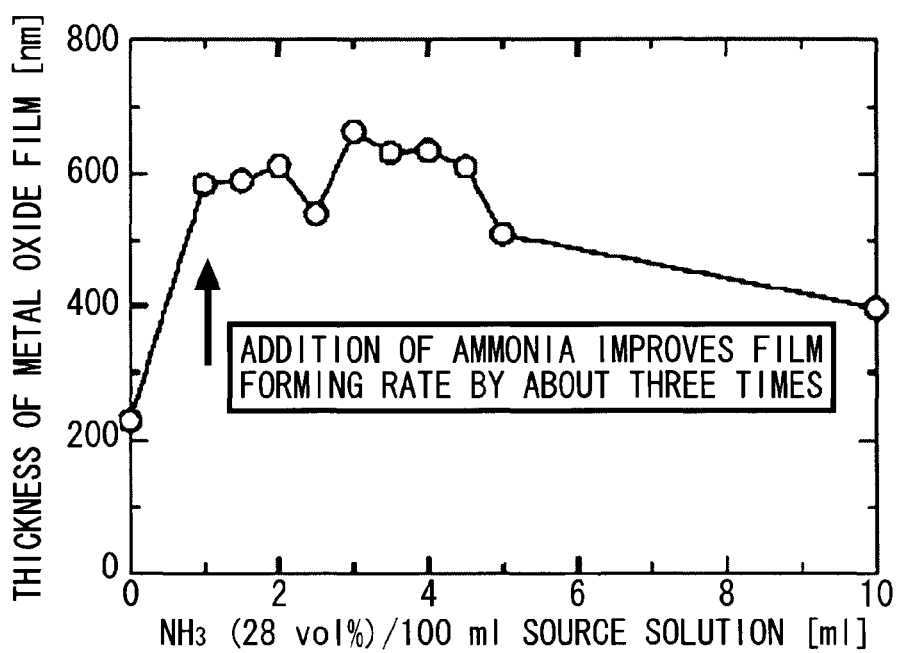
FIG. 6 is another graph for illustrating the effect in the case of employing a method for forming a film of Embodiment 1.

Therefore, the method can further improve the production efficiency of the metal oxide while maintaining low resistance of a metal oxide film formed thereby. FIGS. 5 and 6 are graphs showing experimental data to illustrate the above-mentioned effect.

FIG. 5 shows the results of measurement of the film thickness of the metal oxide film formed when the molar ratio of ammonia to zinc contained in the solution 4 is varied. The vertical axis in FIG. 5 indicates the film thickness (nm) of the metal oxide film formed, and the horizontal axis in FIG. 5 indicates the molar ratio represented by the number of moles of ammonia ($NH_3$)/the number of moles of zinc (Zn).

FIG. 6 shows the results of measurement of a film thickness of the metal oxide film formed when the amount of the ammonia solution 4a, of which concentration by volume is 28 vol %, in 100 ml of the source solution 4b is varied. The vertical axis in FIG. 6 indicates the film thickness (nm) of the metal oxide film formed, and the horizontal axis in FIG. 6 indicates the content (ml) of the ammonia solution 4a, of which concentration by volume is 28 vol %, in 100 ml of the source solution 4b.

Here, in FIGS. 5 and 6, only the content of ammonia in the solution 4 is varied and the contents of other components in the solution 4 are not varied. Further, film forming conditions (such as heating temperature of the substrate 2, atmosphere in the reaction chamber 1, and film forming reaction time) of the metal oxide films in the respective data in FIGS. 5 and 6 are identical with one another.

As the source solution 4b in FIG. 6, a solution, which is formed by adding zinc acetyl acetonate and gallium acetyl acetonate to a mixed solution made of water and nine times its volume of methanol and has a zinc molar concentration of 0.02 mol/L, is employed.

In FIGS. 5 and 6, the heating temperature of the substrate 2 is 280 to 290° C., and a metal oxide film is formed under the condition that the substrate 2 is placed in an atmospheric pressure.

Accordingly, as is apparent from the results shown in FIGS. 5 and 6, when the solution 4 contains ammonia, the film forming rate of the metal oxide film is improved by about three times. By improvement of the film forming rate, it is possible to form a metal oxide film having a predetermined film thickness in a short time. Therefore, the improvement of the film forming rate means that production efficiency of the metal oxide is improved when the solution 4 contains ammonia.

Figure 7:
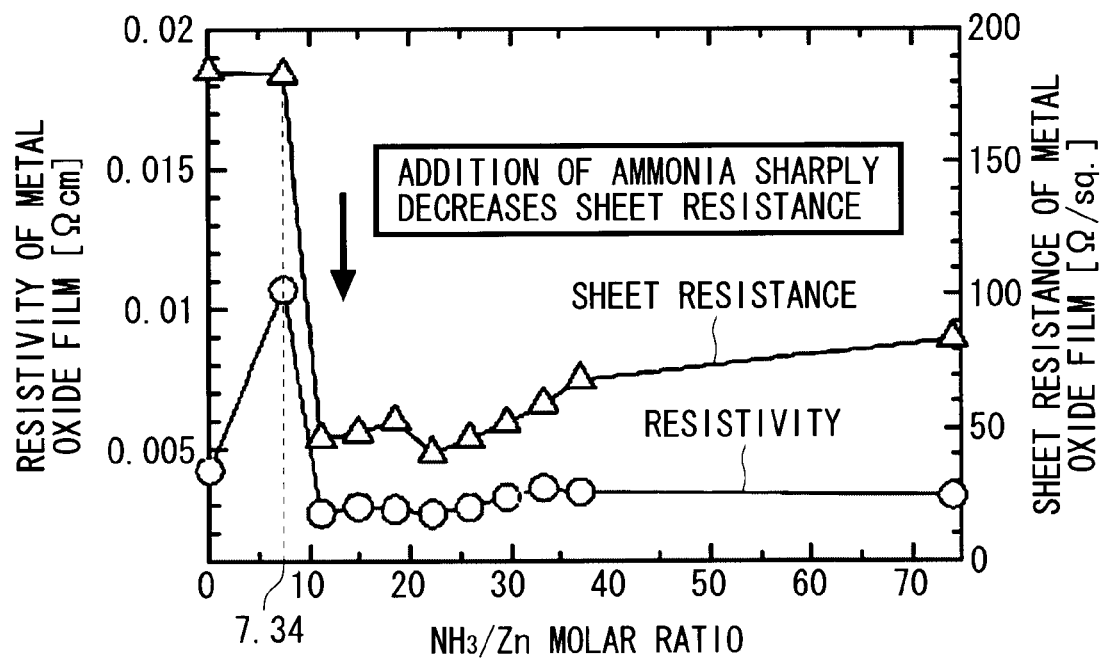
FIG. 7 is another graph for illustrating the effect in the case of employing a method for forming a film of Embodiment 1.
Figure 8:
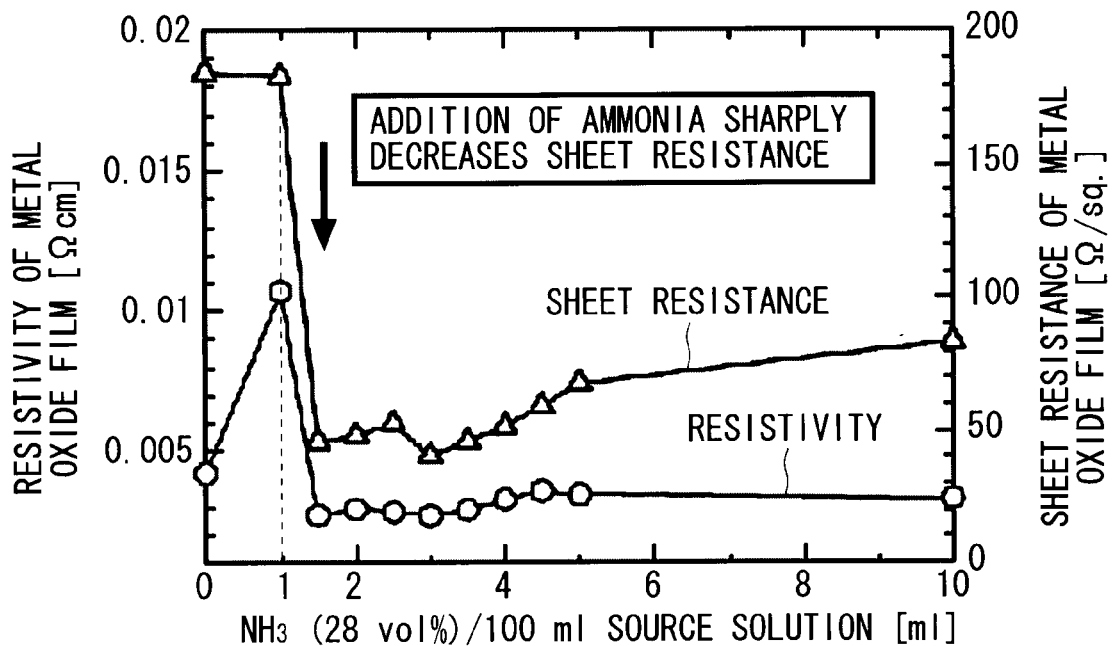
FIG. 8 is another graph for illustrating the effect in the case of employing a method for forming a film of Embodiment 1.

Further, it is apparent from the experimental data shown in FIGS. 7 and 8 that even when the solution 4 contains ammonia, the sheet resistance of the metal oxide film formed thereby is maintained at a value of low resistance.

Here, FIG. 7 shows the results of measurement of the resistivity and the sheet resistance of the metal oxide film formed when the molar ratio of ammonia to zinc contained in the solution 4 is varied. The vertical axis on a left side in FIG. 7 indicates the resistivity ($\Omega$cm) of the metal oxide film formed, and the vertical axis on a right side in FIG. 7 indicates the sheet resistance ($\Omega$/sq) of the metal oxide film formed. The horizontal axis in FIG. 7 indicates the molar ratio represented by the number of moles of ammonia ($NH_3$)/the number of moles of zinc (Zn).

Further, FIG. 8 shows the results of measurement of the resistivity and sheet resistance of the metal oxide film formed when the amount of the ammonia solution 4a, of which concentration by volume is 28 vol %, in 100 ml of the source solution 4b is varied. The vertical axis on a left side in FIG. 8 indicates the resistivity ($\Omega$cm) of the metal oxide film formed, and the vertical axis on a right side in FIG. 8 indicates the sheet resistance ($\Omega$/sq) of the metal oxide film formed. The horizontal axis in FIG. 8 indicates the content (ml) of the ammonia solution 4a, of which concentration by volume is 28 vol %, in 100 ml of the source solution 4b.

Here, in FIGS. 7 and 8, only the content of the ammonia 4a in the solution 4 is varied and the contents of other components in the solution 4 are not varied. Further, film forming conditions (such as heating temperature of the substrate 2, atmosphere in the reaction chamber 1, and film forming reaction time) of the metal oxide films in the respective data in FIGS. 7 and 8 are identical with one another.

Further, as the source solution 4b in FIG. 8, a solution, which is formed by adding zinc acetyl acetonate and gallium acetyl acetonate to a mixed solution made of water and nine times its volume of methanol and has a zinc molar concentration of 0.02 mol/L, is employed.

In FIGS. 7 and 8, the heating temperature of the substrate 2 is 280 to 290° C., and a metal oxide film is formed under the condition that the substrate 2 is placed in an atmospheric pressure.

Accordingly, as is apparent from the results shown in FIGS. 7 and 8, even when the solution 4 contains ammonia, the sheet resistance of the metal oxide film formed thereby is maintained at a value of low resistance. As shown in FIG. 7, the sheet resistance of the metal oxide film formed by use of the solution 4 containing ammonia is smaller than the sheet resistance of the metal oxide film formed by use of the solution not containing ammonia. That is, in FIGS. 7 and 8, when the solution not containing ammonia is used, the sheet resistance of the metal oxide film formed thereby becomes the maximum value.

Herein, generally, it is possible to improve the film forming rate of the metal oxide film by increasing the amount of the metal source to serve as a solute in the solution not containing ammonia. However, when the method of increasing the content of the metal source is employed, the resistivity and the sheet resistance of the metal oxide film formed are considerably deteriorated.

On the other hand, in the present embodiment, since the solution 4 contains ammonia, it becomes possible to improve the film forming rate of the metal oxide film formed while maintaining low resistance thereof, as described with reference to FIGS. 5 to 8.

Moreover, in the present embodiment, data shown in FIGS. 3 and 4 are previously prepared, and the content of ammonia in the solution 4 is determined by use of the data.

Therefore, it is possible to provide a metal oxide film having proper physical properties in accordance with the use of the metal oxide film formed. For example, when the carrier concentration is increased, the resistivity of the metal oxide film formed can be improved (or reduced). However, when the carrier concentration is increased, transmittance of the metal oxide film formed is deteriorated particularly in an infrared region. On the other hand, when the metal oxide film is used as a transparent conductive film for a solar cell which absorbs not only visible light but also infrared light, and generates electricity, e.g., a CIGS (copper indium gallium diselenide)-based solar cell, low resistance and high transmittance of light including an infrared region are required. Accordingly, in the above-mentioned case, from FIGS. 3 and 4, it is not preferred to set the ammonia concentration in the solution 4 at a low level, and it is preferred to set the ammonia concentration in the solution 4 at a high level.

As described above and shown in the present embodiment, by adjusting the content of ammonia in the solution 4, it is possible to adjust the carrier concentration and the mobility of the metal oxide film formed, and as a result of this, it is possible to provide a metal oxide film having physical properties in accordance with the use of the metal oxide film.

Further, when the content of ammonia in the solution 4 containing zinc as a metallic element is determined, it is desired that the solution 4 containing the following amount of ammonia is prepared and a metal oxide film is formed by use of the prepared solution 4. Here, the solution 4 is a solution in which the number of moles of ammonia per liter of the solution 4 is more than "0.15 mol/L", or a solution in which the ratio of the number of moles of ammonia to the number of moles of zinc is more than "7.34". The reason why the solution 4 containing such an amount of ammonia is preferred is derived from experimental data in FIGS. 7 and 8.

It is understood from FIG. 7 that the sheet resistance of the metal oxide film formed decreases sharply by setting the ratio of the number of moles of ammonia to the number of moles of zinc higher than "7.34". Similarly, it can be derived from FIG. 8 that the sheet resistance of the metal oxide film formed decreases sharply by setting the amount of ammonia in the source solution 4b larger than "0.15 mol/L".

That is, the sheet resistance of the metal oxide film formed can be decreased sharply by forming a metal oxide film by use of the solution 4 having a larger ammonia content than the above-mentioned values. In addition, it is also understood from FIGS. 7 and 8 that the resistivity of the metal oxide film formed can be decreased sharply by forming a metal oxide film by use of the solution 4 having a larger ammonia content than the above-mentioned values.

Herein, FIGS. 7 and 8 show the results of experiments carried out based on the following conditions, as described above. That is, a metallic element contained in the solution 4 is zinc, and the molar concentration of zinc in the solution 4 is 0.02 mol/L. Moreover, the ammonia solution (the molar concentration of the ammonia solution is 14.76 mol/L, the specific gravity of the ammonia solution is 0.8996 g/cm$^3$) 4a having a concentration by volume of 28 vol % is employed.

It is understood from FIG. 8 that the sheet resistance and the resistivity of the metal oxide film decrease sharply when the above-mentioned ammonia solution 4a is added in an amount of more than 1 ml to 100 ml of the source solution 4b (that is, the amount of the solution 4 is 101 ml). If this 1 ml is converted into the number of moles of ammonia in the 1 liter of the solution 4 (the ammonia solution+the source solution), this 1 ml corresponds to the above-mentioned "0.15 mol/L". In the above-mentioned conversion, 17 g/mol is used as the mass number of $NH_3$.

Further, at least any one of titanium, zinc, indium and tin can be employed as the metal source contained in the solution 4. When these metal source are employed, a transparent conductive film can be formed on the substrate 2.

Further, in a state where titanium, zinc, indium and tin are contained in the solution 4, at least any one of boron, nitrogen, fluorine, magnesium, aluminum, phosphorus, chlorine, gallium, arsenic, niobium, indium and antimony may be contained in the solution 4 as a dopant.

Some kinds of the dopant can bring a metal oxide film (transparent conductive film), which is an n-type semiconductor, into a more electron-rich state. In this case, electric resistance of the metal oxide film (transparent conductive film) formed can be further reduced. Further, some kinds of the dopant can change a metal oxide film to a p-type semiconductor. In the metal oxide film of the p-type semiconductor, a hole can serve as a carrier to have a conductive property, and the metal oxide film becomes more useful as a light-emitting device rather than as a transparent conductive film.

Further, as described above, the metal oxide film may be formed on the substrate 2 under an atmospheric pressure by setting the internal pressure of the reaction chamber 1 at an atmospheric pressure. Thereby, equipment such as a vacuum apparatus can be omitted, and therefore the cost of the film forming apparatus 100 can be reduced.

On the other hand, as described above, a vacuum pump capable of reducing the internal pressure of the reaction chamber 1 may be provided. Then, a metal oxide film may be formed on the substrate 2 in an atmosphere of a reduced pressure while reducing the internal pressure of the reaction chamber 1 within a range of 0.0001 to 0.1 MPa. Thereby, the cost of the film forming apparatus 100 increases, but it becomes possible to form a metal oxide film of better quality than the metal oxide film formed in an atmospheric pressure on the substrate 2.

Embodiment 2

Figure 9:
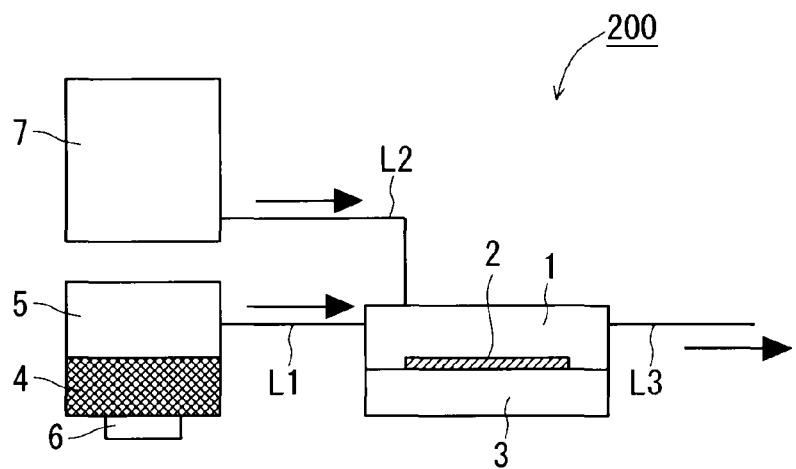
FIG. 9 is a drawing showing a schematic configuration of an apparatus for forming a metal oxide film of Embodiment 2.

FIG. 9 is a drawing showing a schematic configuration of an apparatus for forming a metal oxide film of the present embodiment.

As is apparent from the comparison between FIG. 1 and FIG. 9, an apparatus 200 for forming a metal oxide film of the present embodiment is configured with an ozone generator 7 in addition to the apparatus 100 for forming a metal oxide film of Embodiment 1. Further, in the film forming apparatus 200, a path L2 is disposed in order to supply ozone from the ozone generator 7 to the reaction chamber 1.

The configuration of the film forming apparatus 200 is similar to that of the film forming apparatus 100 except that the ozone generator 7 and the path L2 are additionally provided. Therefore, refer to Embodiment 1 for the descriptions of equipment other than those of the ozone generator 7 and the path L2.

The ozone generator 7 can generate ozone. The ozone generated in the ozone generator 7 is supplied toward the first main surface of the substrate 2 in the reaction chamber 1 through the path L2 different from the path L1. In the ozone generator 7, for example, an oxygen molecule is decomposed by applying a high voltage between parallel electrodes disposed in parallel and passing oxygen between the electrodes, and ozone can be generated by coupling the decomposed oxygen with another oxygen molecule.

In addition, when ozone and the misty solution 4 is supplied to the reaction chamber 1, the ozone reacts with the solution 4 on the substrate 2 being heated and a predetermined metal oxide film is formed on the first main surface of the substrate 2. The metal oxide film formed depends on the kind of the solution 4, and examples thereof include transparent conductive films such as indium oxide, zinc oxide, and tin oxide films. Here, the unreacted ozone or solution 4 in the reaction chamber 1 is always (continuously) discharged out of the reaction chamber 1 through the path L3.

Next, a method for forming a metal oxide film of the present embodiment will be described.

First, as described in Embodiment 1 (refer to FIGS. 2, 3 and 4), the content of ammonia in the solution 4 is determined. Then, the solution 4 containing the determined content of ammonia is prepared in the solution container 5.

After the solution 4 is prepared in the solution container 5, the solution 4 is formed into a mist by the mist forming unit 6 in the solution container 5. The solution 4 formed into a mist is supplied to the reaction chamber 1 through the path L1. Further, ozone is generated in the ozone generator 7. The generated ozone is supplied to the reaction chamber 1 through the path L2.

Meanwhile, the substrate 2 placed on the heating unit 3 is heated to a metal oxide film forming temperature by the heating unit 3, and the temperature of the substrate 2 is maintained at the metal oxide film forming temperature. For example, the temperature of the substrate 2 is maintained at 250° C. or less.

The ozone and the misty solution 4 are supplied to the first main surface of the substrate 2 being heated. The contact of the ozone and the misty solution 4 with the heated substrate 2 causes the thermal decomposition of the ozone to produce an oxygen radical, and the decomposition of the solution 4 is accelerated by the oxygen radical to form a predetermined metal oxide film on the first main surface of the substrate 2.

Here, the step of forming a film may be a step of supplying the solution 4 and the ozone to the substrate 2 disposed under an atmospheric pressure and forming a metal oxide film on the substrate 2. On the other hand, it is also possible to employ a step of supplying the solution 4 and the ozone to the substrate 2 disposed in an atmosphere of a reduced pressure (e.g., 0.0001 to 0.1 MPa) by including additionally a vacuum pump (not shown) capable of reducing the internal pressure of the reaction chamber 1 in the film forming apparatus 200, and forming a metal oxide film on the substrate 2.

As described above, in the method for forming a metal oxide film of the present embodiment, the solution 4 containing a metal salt, a metal complex or a metal alkoxide compound, dissolved therein as a metal source, is formed into a mist. Moreover, in the reaction chamber 1 in an atmosphere containing ozone, the misty solution 4 is brought into contact with the heated substrate 2.

Therefore, since ozone and active oxygen produced by the decomposition of ozone due to heat or the like are highly reactive, decomposition/oxidation of material compounds in the solution 4 is accelerated. Thereby, the metal oxide film can be formed on the substrate 2 even under low-temperature heating. The decomposition of ozone starts from about 200° C. (that is, the oxygen radical starts to be produced from ozone by a heating temperature of 200° C.). Therefore, even when the heating temperature of the substrate 2 is about 200° C., a metal oxide film can be formed on the substrate 2.

Figure 10:
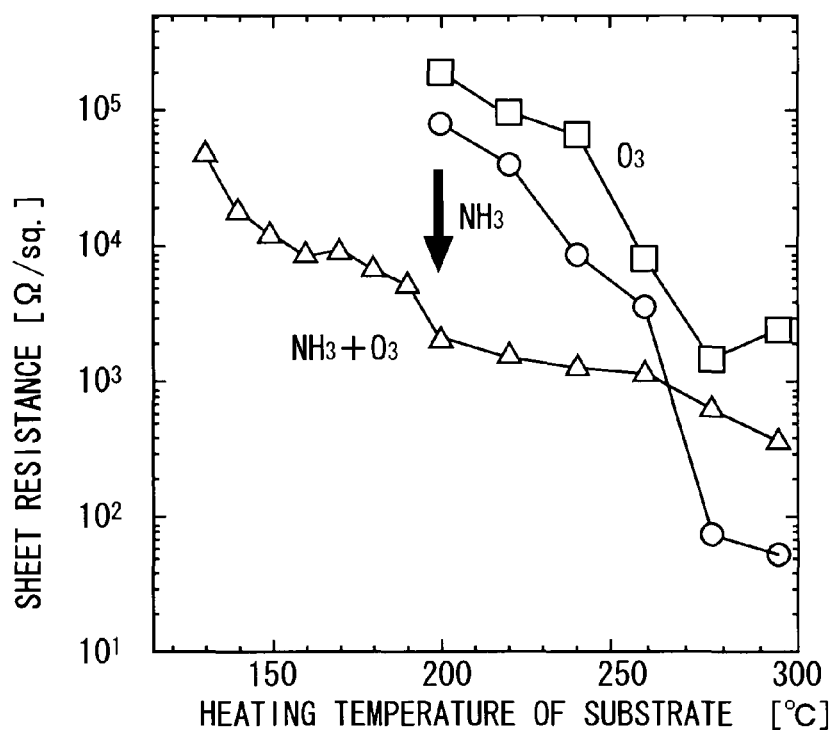
FIG. 10 is a graph for illustrating the effect in the case of employing a method for forming a film of Embodiment 2.

Further, by employing the method for forming a metal oxide film of the present embodiment, it is possible to further reduce the sheet resistance of a metal oxide film formed in a low-temperature region of the heating temperature of the substrate 2 in comparison with Embodiment 1. FIG. 10 shows experimental data showing the effect of the invention of the present embodiment.

The vertical axis in FIG. 10 indicates the sheet resistance (Ω/sq) of the metal oxide film formed, and the horizontal axis in FIG. 10 indicates the heating temperature (° C.) of the substrate 2. Further, in FIG. 10, data represented by "circle marks" represent a relationship between the heating temperature of the substrate 2 and the sheet resistance of the metal oxide film formed in the case of supplying the solution 4 (not containing ozone) containing ammonia to the substrate 2 in the reaction chamber 1, that is, in the case of Embodiment 1. Further, data represented by "triangle marks" represent a relationship between the heating temperature of the substrate 2 and the sheet resistance of the metal oxide film formed in the case of supplying the solution 4 containing ammonia and the ozone to the substrate 2 in the reaction chamber 1, that is, in the case of Embodiment 2. In addition, data represented by "square marks" represent a relationship between the heating temperature of the substrate 2 and the sheet resistance of the metal oxide film formed in the case of supplying the solution 4 not containing ammonia and the ozone to the substrate 2 in the reaction chamber 1.

It is understood from FIG. 10 that when the substrate 2 is heated at a low temperature of about 265° C. or less and a metal oxide film is formed on the substrate 2, the sheet resistance of the metal oxide film formed in Embodiment 2 is lower than that in Embodiment 1.

That is, when the ozone is supplied to the substrate 2 in addition to the solution 4, the sheet resistance of the metal oxide film formed can be improved compared with the case where the ozone is not supplied to the substrate 2 in the case where the heating temperature of the substrate 2 is further reduced. Particularly, when the heating temperature of the substrate 2 is about 200° C., the sheet resistance of the metal oxide film formed by the method of Embodiment 2 is about two orders of magnitude lower than that of the metal oxide film formed by the method of Embodiment 1.

Further, as is apparent from the configuration shown in FIG. 9, the solution 4 and the ozone are supplied separately to the substrate 2 through the different paths L1 and L2. In the configuration in FIG. 9, the solution 4 is supplied toward the substrate 2 in the reaction chamber 1 through the path L1. Meanwhile, the ozone is supplied toward the substrate 2 in the reaction chamber 1 through the path L2.

As described above, by supplying the solution 4 and the ozone to the substrate 2 through the different paths L1 and L2, it is possible to limit a location where the ozone is mixed with the solution 4 to only the reaction chamber 1 (a region in which the substrate 2 is disposed). That is, it is possible to prevent the solution 4 from mixing with the ozone in a path thorough which the solution 4 and the ozone is supplied. Accordingly, the reaction between the solution 4 and the ozone can be limited to the region in which the substrate 2 is disposed, and reaction efficiency at the substrate 2 can be improved. Further, there may be cases where, due to mixing of the solution 4 with the ozone in the process of supply, the solution 4 reacts with the ozone to produce an unintended reactant in a vapor phase before the solution 4 and the ozone reach the substrate 2. The production of the unintended reactant results in hindrance (reduction in film quality and reduction in a film forming rate due to the deposition of the unintended reactant) in the growth of a film on the surface of a substrate. Therefore, it is possible to inhibit such production of the unintended reactant by supplying the solution 4 and the ozone to the substrate 2 through the different paths L1 and L2.

The film forming apparatus 200 may further include a control part (not shown) to perform the following control. The control part controls the supply of the solution 4 formed into a mist and the ozone so that the solution 4 and the ozone are supplied simultaneously or separately at predetermined timings to the substrate 2 in the reaction chamber 1.

By supplying the solution 4 formed into a mist and the ozone simultaneously to the substrate 2 in the reaction chamber 1, it is possible to sufficiently use the ozone reactivity (oxidizing power) in the reaction chamber 1. On the other hand, by supplying the solution 4 formed into a mist and the ozone to the substrate 2 in the reaction chamber 1 at separate timings, it is possible to inhibit the reaction between the ozone and the solution 4 at a location other than the surface of the substrate 2.

In addition, by supplying the solution 4 formed into a mist and the ozone to the substrate 2 in the reaction chamber 1 at separate timings, it becomes impossible to sufficiently use the ozone reactivity (oxidizing power) in the reaction chamber 1. However, by supplying the ozone while heating the substrate 2, characteristics of the formed metal oxide film are improved (for example, an improvement in crystallinity, and an improvement in electrical resistance depending on the mobility and carrier concentration).

Further, in Embodiments 1 and 2, only one solution container 5 is disposed, but a plurality of solution containers can also be disposed in order to fill different kinds of solutions into the containers. In the case of this configuration, a mist forming unit is disposed in each solution container, and a path for each solution is disposed separately between each solution container and the reaction chamber 1. Further, in the case of this configuration, the respective solutions may be supplied simultaneously, or may be supplied at different timings in a predetermined order.

Further, in the case of Embodiment 2 including the plurality of solution containers, while the supply of the ozone is continued, different solutions may be supplied in a predetermined order. Alternatively, the respective solutions and the ozone may be supplied separately at different timings. In addition, in either supply mode, it is desired that the respective solutions and the ozone are supplied toward the substrate 2 in the reaction chamber 1 through different paths.

In Embodiment 2, the film forming apparatus 200 can include additionally an ultraviolet light generator which delivers ultraviolet light (wavelength: about 10 nm to 400 nm) to the ozone supplied to the substrate 2. In this configuration, the ozone is decomposed into oxygen radicals by the ultraviolet irradiation, which can accelerate a reaction for forming a metal oxide film in the reaction chamber 1 (more specifically, on the first main surface of the substrate 2). Moreover, since the ozone to be supplied to the reaction chamber 1 is decomposed into oxygen radicals by the ultraviolet irradiation, the heating unit 3 to heat the substrate 2 can be omitted. In addition, it is desired to heat the substrate 2 also in the case of the configuration of ultraviolet irradiation from the viewpoint of acceleration of the reaction. Moreover, in the case of the configuration of ultraviolet irradiation, oxygen may be employed in place of ozone.

Further, in Embodiment 2, the film forming apparatus 200 can also include additionally a plasma generator which forms plasma of the ozone supplied to the substrate 2. In this configuration, the ozone is decomposed into oxygen radicals by the plasma, which can accelerate a reaction for forming a metal oxide film in the reaction chamber 1 (more specifically, on the first main surface of the substrate 2). Moreover, since the ozone to be supplied to the reaction chamber 1 is decomposed into oxygen radicals by the plasma, the heating unit 3 to heat the substrate 2 can be omitted. In addition, it is desired to heat the substrate 2 also in the case of a configuration including a plasma generator from the viewpoint of acceleration of the reaction. Moreover, in the case of the configuration including a plasma generator, oxygen may be employed in place of ozone.

In addition, the metal oxide film (referred to as a former film) formed by the film forming method of Embodiments 1 and 2 and the metal oxide film (referred to as a latter film) formed by the film forming method in which the solution 4 does not contain ammonia were measured using SIMS (secondary ion mass spectrometry). Consequently, it was observed that the amount of nitrogen atoms contained in the former film was larger than that of nitrogen atoms contained in the latter film. For example, while the amount of nitrogen atoms in the latter film was $1 \times 10^{18}$ atoms/cm$^3$, the amount of nitrogen atoms in the former film was $5 \times 10^{18}$ atoms/cm$^3$. It is thought that the increase in the number of nitrogen atoms results from the use of the solution 4 containing ammonia in the film forming method of the present invention.

The present invention has been described in detail, but the above-mentioned description is illustrative in all aspects and the present invention is not intended to be limited thereto. Various modifications not exemplified are construed to be made without departing from the scope of the present invention.

DESCRIPTION OF REFERENCE SIGNS

1: reaction chamber
2: substrate
3: heating unit
4: solution
4a: ammonia solution
4b: source solution
5: solution container
5a, 5b: container 6: mist forming unit
7: ozone generator
L1, L2, L3: path
100, 200: film forming apparatus

The invention claimed is:

1. A method for forming a metal oxide film, the method comprising:
   (A) forming a solution comprising a metallic element and ammonia into a mist;
   (B) heating a substrate, wherein the heating temperature is maintained at 300° C. or less; and
   (C) supplying the mist from (A) onto a first main surface of the substrate from (B) to form a metal oxide film,
   wherein the metal oxide film is a n-type semiconductor.

2. The method of claim 1, further comprising:
   (D) previously preparing data, which shows relationships between an ammonia content of the solution, a carrier concentration of the metal oxide film formed, and a mobility of the metal oxide film formed, prior to the forming (A); and
   (E) determining the ammonia content of the solution with the data from (D), and preparing the solution comprising a determined ammonia content.

3. The method of claim 2, wherein the metallic element is zinc, and
   wherein (E) comprises preparing the solution in which a ratio of a number of moles of the ammonia to a number of moles of the zinc is more than 7.34.

4. The method of claim 2, wherein the metallic element is zinc, and
   wherein (E) comprises preparing the solution in which a number of moles of the ammonia per liter of the solution is more than 0.15 mol/L.

5. The method of claim 2, wherein the metallic element is at least one selected from the group consisting of titanium, zinc, indium, and tin.

6. The method of claim 2, wherein the supplying (C) comprises supplying the mist from (A) and ozone onto the first main surface of the substrate from (B).

7. The method of claim 1, wherein
   the metallic element is at least one selected from the group consisting of titanium, zinc, indium, and tin.

8. The method of claim 1, wherein
   the supplying (C) comprises supplying the mist from (A) and ozone onto the first main surface of the substrate from (B).

9. The method of claim 1, wherein the metallic element comprises titanium and zinc.

10. The method of claim 1, wherein the metallic element comprises titanium and indium.

11. The method of claim 1, wherein the metallic element comprises titanium and tin.

12. The method of claim 1, wherein the metallic element comprises zinc and indium.

13. The method of claim 1, wherein the metallic element comprises zinc and tin.

14. The method of claim 1, wherein the metallic element comprises indium and tin.

15. The method of claim 1, wherein the metallic element comprises titanium, zinc, and indium.

16. The method of claim 1, wherein the metallic element comprises titanium, zinc, and tin.

17. The method of claim 1, wherein the metallic element comprises zinc, indium, and tin.

18. The method of claim 1, wherein the metallic element comprises titanium, zinc, indium, and tin.

19. The method of claim 1, wherein the metallic element is zinc.

* * * * *